United States Patent
Rhee et al.

(10) Patent No.: US 9,707,714 B2
(45) Date of Patent: *Jul. 18, 2017

(54) APPARATUS AND METHOD FOR MANUFACTURING FINE PATTERN USING INTERFEROGRAM OF OPTICAL AXIS DIRECTION

(75) Inventors: Hyug-Gyo Rhee, Daejeon (KR); Yun Woo Lee, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 885 days.

This patent is subject to a terminal disclaimer.

(21) Appl. No.: 13/884,581

(22) PCT Filed: Jul. 24, 2012

(86) PCT No.: PCT/KR2012/005899
§ 371 (c)(1),
(2), (4) Date: May 9, 2013

(87) PCT Pub. No.: WO2013/058471
PCT Pub. Date: Apr. 25, 2013

(65) Prior Publication Data
US 2013/0234368 A1 Sep. 12, 2013

(30) Foreign Application Priority Data
Oct. 19, 2011 (KR) .................. 10-2011-0107131

(51) Int. Cl.
*B29C 59/16* (2006.01)
*G03F 7/20* (2006.01)

(52) U.S. Cl.
CPC .......... *B29C 59/16* (2013.01); *G03F 7/70383* (2013.01); *G03F 7/70408* (2013.01); *G03F 7/70566* (2013.01)

(58) Field of Classification Search
CPC ..... B29C 59/00; B29C 59/16; G03F 7/70383; G03F 7/70408
(Continued)

(56) References Cited

U.S. PATENT DOCUMENTS 6,248,509 B1 * 6/2001 Sanford ................. G02B 26/02
430/396
6,549,270 B1 * 4/2003 Ota ...................... G03F 7/70233
355/53

(Continued)

FOREIGN PATENT DOCUMENTS

| JP | 06-291038 A | 10/1994 |
| JP | 2000-131015 A | 5/2000 |
| WO | WO2012013320 A2 * | 2/2012 |

OTHER PUBLICATIONS

Korean Intellectual Property Office/ISA, International Search Report on Application No. PCT/KR2012/005899, issued Jan. 30, 2013.

(Continued)

*Primary Examiner* — Nahida Sultana
(74) *Attorney, Agent, or Firm* — Perkins IP Law Group LLC; Jefferson Perkins

(57) ABSTRACT

The fine pattern manufacturing apparatus, which can improve height direction resolution in a laser irradiation method. More specifically, the invention relates to a fine pattern manufacturing apparatus using interference and a fine pattern manufacturing method using the manufacturing apparatus, in which a height direction interference generation unit is included to interfere laser beams respectively having a different plane direction width, and height direction line width can be improved by irradiating an interference laser beam having an interference fringe direction of height direction on a photosensitive film.

5 Claims, 5 Drawing Sheets

(58) Field of Classification Search
USPC .............. 264/400; 425/174.4, 150; 356/450, 356/491–521
See application file for complete search history.

(56) References Cited

U.S. PATENT DOCUMENTS

| | | | | |
|---|---|---|---|---|
| 6,842,255 | B2* | 1/2005 | Ohsaki | G01B 9/02039 356/450 |
| 6,882,477 | B1* | 4/2005 | Schattenburg | G03F 7/70383 359/35 |
| 7,599,069 | B2* | 10/2009 | Toussaint, Jr. | G02B 27/286 353/20 |
| 8,908,192 | B2* | 12/2014 | Goeppert | G03F 7/70591 356/520 |
| 9,223,223 | B2* | 12/2015 | Rhee | G03F 7/2053 |
| 2004/0114150 | A1* | 6/2004 | Wegmann | G01J 4/04 356/491 |
| 2004/0214415 | A1* | 10/2004 | Pellizzer | H01L 21/823835 438/583 |
| 2006/0164649 | A1* | 7/2006 | Rosengaus | G01J 3/02 356/450 |
| 2008/0186502 | A1* | 8/2008 | Studer | G01B 11/105 356/450 |
| 2009/0170932 | A1* | 7/2009 | Aggarwal | A01N 41/12 514/474 |
| 2011/0292376 | A1* | 12/2011 | Kukushkin | G01J 1/58 356/73 |
| 2012/0008482 | A1* | 1/2012 | Bablumyan | G03H 1/02 369/103 |
| 2012/0140242 | A1* | 6/2012 | Feng | G01J 9/02 356/521 |
| 2012/0281223 | A1* | 11/2012 | Mortimer | G01B 9/0209 356/456 |
| 2013/0148105 | A1* | 6/2013 | Goeppert | G03F 7/70591 356/51 |
| 2013/0301055 | A1* | 11/2013 | Bornhop | G01B 9/02041 356/450 |
| 2014/0036329 | A1* | 2/2014 | Kang | G03H 1/2294 359/9 |
| 2015/0331167 | A1* | 11/2015 | Escuti | G03H 1/0476 359/3 |

OTHER PUBLICATIONS

Rhee, Hyug-Gyo et al., "Improvement of linewidth in laser beam lithographed computer generated hologram," Optics Express, Jan. 18, 2010, vol. 18, No. 2, p. 1734-1740.

* cited by examiner

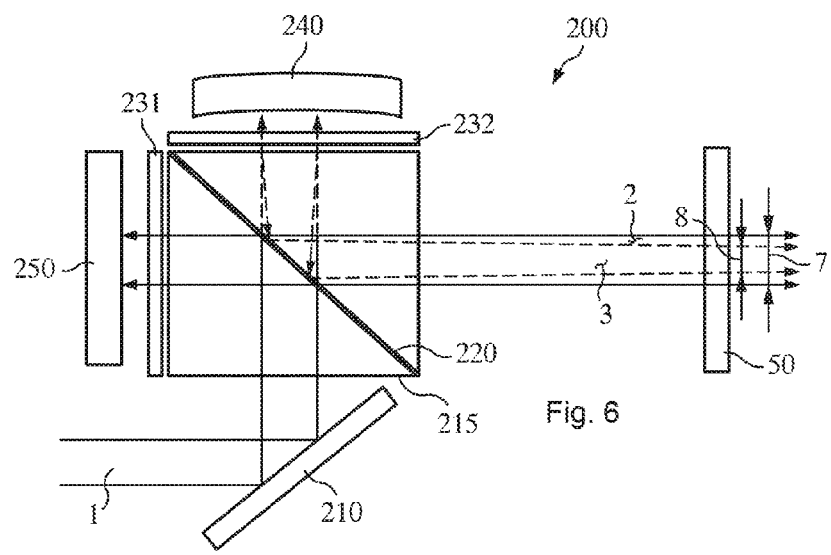
Fig. 6
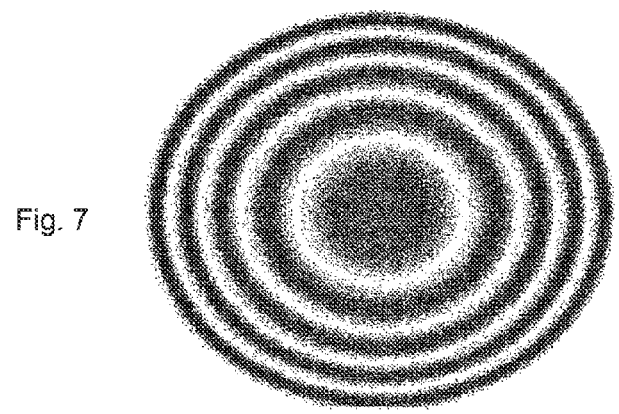
Fig. 7
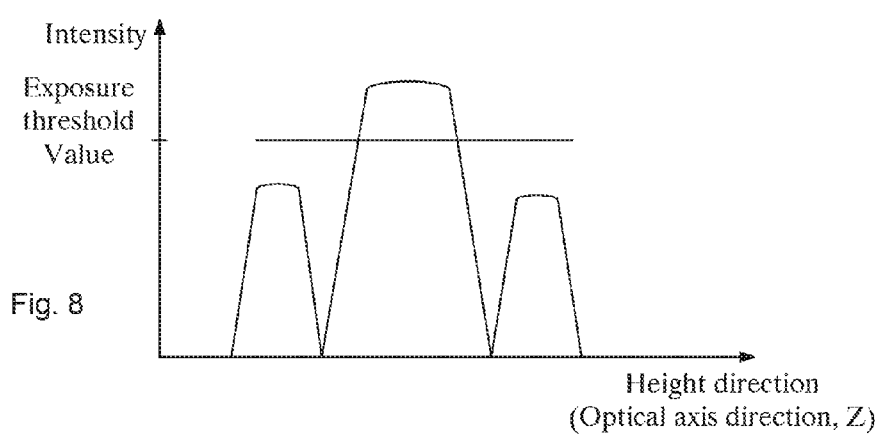
Fig. 8
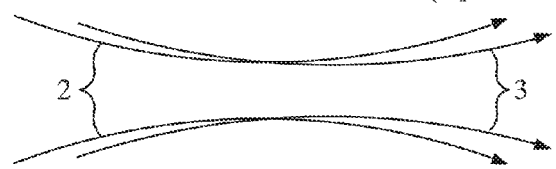

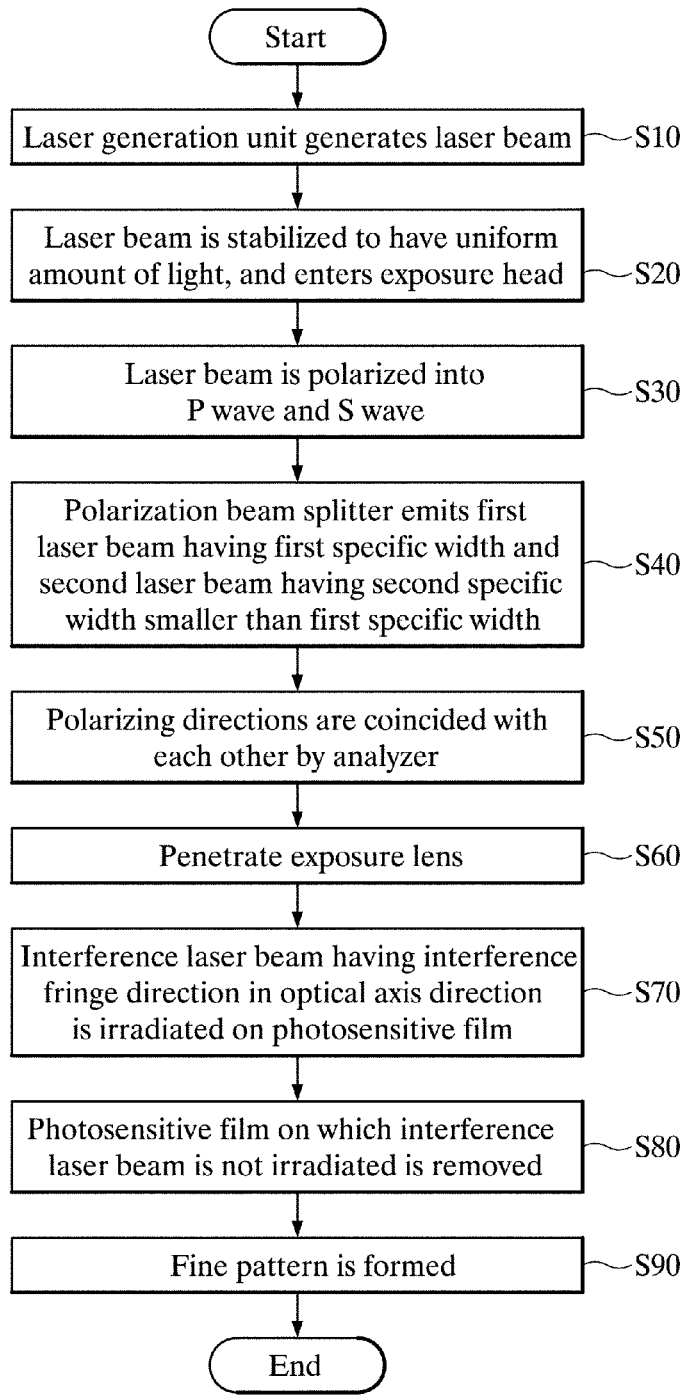

APPARATUS AND METHOD FOR MANUFACTURING FINE PATTERN USING INTERFEROGRAM OF OPTICAL AXIS DIRECTION

TECHNICAL FIELD

The present invention relates to a fine pattern manufacturing apparatus using interference and a fine pattern manufacturing method using the fine pattern manufacturing apparatus, which can improve height direction resolution in a laser irradiation method. More specifically, the invention relates to a fine pattern manufacturing apparatus using interference and a fine pattern manufacturing method using the manufacturing apparatus, in which a height direction interference generation unit is included to interfere laser beams respectively having a different plane direction width, and height direction line width can be improved by irradiating an interference laser beam having an interference fringe direction of height direction on a photosensitive film.

BACKGROUND ART

A method of manufacturing a fine pattern includes a photo lithography method, an ion beam method, a laser exposure method and the like. Here, since line width of an ion beam is narrow, a fine pattern having a further fine line width can be fabricated, and thus the ion beam method is used to manufacture a cutting-edge product or a semiconductor of high integrity. The laser exposure method forms the fine pattern through an etching process by irradiating a laser beam after coating a substrate with a photosensitive film whose properties are changed by the laser beam.

However, although such a laser exposure method may fabricate a fine pattern in a speedy way, the line width in the plane direction is thick compared with that of the ion beam method, and thus the width of the fine pattern is limited. In addition to the line width in the plane direction, it is difficult to control depth of exposure (i.e., depth of the photosensitive film whose properties are changed when the laser is irradiated on the photosensitive film) or to finely set a value of the depth of exposure.

In a conventional technique, in order to reduce the depth of exposure (hereinafter, referred to as a height direction line width), a lot of studies for reducing the plane direction line width of the laser beam have been conducted since the height direction line width is proportional to the plane direction line width of the laser beam around the focus. However, such a plane direction line width is limited due to diffraction limit of an exposure lens. Here, the plane direction line width according to the diffraction limit is defined by mathematical expression 1 shown below.

$$2W_0 = \frac{1.22\lambda}{NA} \quad \text{[Mathematical expression 1]}$$

Here, denotes a wavelength of a laser beam, $2W_0$ denotes a plane direction line width around the focus, and NA denotes the number of apertures of an exposure lens (diameter of exposure lens/focal distance). Accordingly, due to the diffraction limit, the size of the plane direction line width is limited depending on the wavelength of the laser. Furthermore, in the case where the photosensitive film is formed as multiple layers, although only the photosensitive film positioned on the top layer needs to be exposed, undesired photosensitive films are deformed if the height direction line width is not controlled, and thus it is worried that defective products are mass produced. Particularly, the height direction line width needs to be finely fabricated recently in order to manufacture and use laminated semiconductors.

FIG. 1 is a side view mimetically showing a laser beam 10 passing through an exposure lens 110 and irradiated on a photosensitive film 6 having triple layers in a conventional technique. FIG. 2 is an enlarged view showing the laser beam 1 around the focus, passing through the exposure lens 110 of FIG. 1 in the conventional technique. In addition, FIG. 3 is an enlarged view showing the laser beam 1 around the photosensitive film 6, passing through the exposure lens 110 of FIG. 1 in the conventional technique, and FIG. 4 is a graph showing a relation between height direction (Z-axis direction) and intensity of laser beam, from which exposure depth formed by a conventional fine pattern manufacturing apparatus can be figured out.

As shown in FIGS. 1 to 4, in the case of a fine pattern manufacturing apparatus according to a conventional laser exposure method, height direction line width H is larger than a desired exposure depth, and thus defective products are mass produced. Since such a height direction line width H is defined by mathematical expression 2 shown below, the height direction lien width H is also limited by the wavelength of a laser beam like the plane direction line width $2W_0$.

$$H = \frac{2\pi W_0^2}{\lambda} \quad \text{[Mathematical expression 2]}$$

Accordingly, required is a laser exposure method, in which an interference laser beam having an interference fringe direction is formed in the height direction, and the resolution of height direction can be improved by controlling line width of height direction to be reduced.

DISCLOSURE OF INVENTION

Technical Problem

Accordingly, the present invention has been made in order to solve the above problems, and it is an object of the invention to provide a fine pattern manufacturing apparatus using interference and a fine pattern manufacturing method using the manufacturing apparatus, in which a height direction interference generation unit is included to interfere laser beams respectively having a different plane direction width, and height direction line width can be improved by irradiating an interference laser beam having an interference fringe direction of height direction on a photosensitive film.

Solution to Problem

In order to accomplish the above object of the invention, according to one aspect of the invention, there is provided a fine pattern manufacturing apparatus capable of improving height direction resolution using interference in a laser irradiation method, the apparatus including: a laser generation unit for generating a laser beam having a first specific width; a beam splitter for emitting a first laser beam by reflecting some of the generated and entered laser beam, and emitting a second laser beam by penetrating the other laser beam; a plane mirror for reflecting the first laser beam emitted from the beam splitter and inputting the first laser beam into the beam splitter again; a spherical mirror for reflecting the second laser beam emitted from the beam splitter and inputting a second laser beam having a second specific width smaller than a first specific width into the beam splitter again; an analyzer into which the first laser beam having the first specific width and the second laser beam having the second specific width are inputted; and an exposure lens for penetrating the first laser beam and the second laser beam passing through the analyzer, and irradiating an interference laser beam generated by interference between the first laser beam and the second laser on a photosensitive film coated on a substrate, wherein the first laser beam and the second laser beam interfere with each other to have an interference fringe direction of height direction around a focus of the exposure lens.

The beam splitter is configured with a polarization beam splitter.

The fine pattern manufacturing apparatus further includes a polarizing plate provided between the laser generation unit and the polarization beam splitter, for penetrating the laser beam generated by the laser generation unit and polarizing the laser beam into an S wave and a P wave whose polarization directions are perpendicular to each other.

The fine pattern manufacturing apparatus further includes quarter wave plates provided between the polarization beam splitter and the plane mirror and between the polarization beam splitter and the spherical mirror, for polarizing incident light by 45 degrees.

The photosensitive film is configured as multiple layers of two or more laminated layers.

The fine pattern manufacturing apparatus further includes an exposure head in which the beam splitter, the plane mirror, the spherical mirror, the analyzer and the exposure lens are installed.

The fine pattern manufacturing apparatus further includes an X stage for moving the exposure head in an X-axis direction, i.e., an axis in a plane direction; a substrate installation unit on which the substrate is installed; and a Y stage for moving the substrate installation unit in a Y-axis direction, i.e., a plane direction perpendicular to the X-axis direction.

The fine pattern manufacturing apparatus further includes a rotation stage for rotating the substrate installation unit on a Z-axis, i.e., a vertical axis.

The fine pattern manufacturing apparatus further includes a control unit for controlling at least any one of the X stage, the Y stage and the rotation stage.

The fine pattern manufacturing apparatus further includes a focus adjustment unit for adjusting a focus of the exposure lens by adjusting a distance between the exposure lens and the photosensitive film.

According to another aspect of the invention, there is provided a fine pattern manufacturing method using a fine pattern manufacturing apparatus, which can improve height direction resolution using interference in a laser irradiation method, the method including: a step in which a laser generation unit generates a laser beam having a first specific width; a step in which the laser beam generated by the laser generation unit enters a beam splitter, and a first laser beam is emitted by reflecting some of the laser beam and a second laser beam is emitted by penetrating the other laser beam; a step in which the first laser beam emitted from the beam splitter is reflected by a plane mirror and enters the beam splitter again, and the second laser beam emitted from the beam splitter is reflected by a spherical mirror and enters the beam splitter again as a second laser beam having a second specific width smaller than the first specific width; a step in which the first laser beam and the second laser beam enter the analyzer, and polarization directions thereof coincide with each other; a step in which the first laser beam and the second laser beam are transmitted to the exposure lens; a step in which an interference laser beam having an interference fringe direction of height direction is formed by interference between the first laser beam and the second laser around a focus of the exposure lens, and the interference laser beam is irradiated on the photosensitive film coated on a substrate; and a step in which properties of the photosensitive film on which the interference laser beam is irradiated are changed, and the fine pattern is formed by removing the photosensitive film on which the interference laser beam is not irradiated.

The fine pattern manufacturing method further includes, after the step of generating a laser beam, a step in which the laser beam is transmitted to the polarizing plate and polarized into an S wave and a P wave whose polarization directions are perpendicular to each other, in which in the steps of emitting and inputting the laser beam, the beam splitter is configured with a polarization beam splitter, and the S wave penetrating the polarizing plate is transformed into the P wave by being reflected by the polarization beam splitter, penetrating a first quarter wave plate, being reflected by the plane mirror and penetrating the first quarter wave plate again, penetrates the polarization beam splitter, and is emitted as the first laser beam having the first specific width, and the P wave penetrating the polarizing plate is transformed into the S wave by being transmitted to the polarization beam splitter, penetrating a second quarter wave plate, being reflected by the spherical mirror and penetrating the second quarter wave plate again, and emitted from the polarization beam splitter as the second laser beam having the second specific width smaller than the first specific width.

The fine pattern manufacturing method further includes any one of the steps of, in which a substrate installation unit on which the substrate is installed is provided, and an X stage for moving the exposure head in an X-axis direction, i.e., an axis in a horizontal direction, a Y stage for moving the substrate installation unit in a Y-axis direction, i.e., a horizontal direction perpendicular to the X-axis direction, and a rotation stage for rotating the substrate installation unit on a Z-axis, i.e., a vertical axis, are further included, moving the exposure head in the X-axis direction while controlling a moving speed by driving the X stage by a control unit, moving the substrate installation unit in the Y-axis direction while controlling a moving speed by driving the Y stage by the control unit, and rotating the substrate installation unit while controlling a rotation speed by driving the rotation stage by the control unit.

Advantageous Effects of Invention

Accordingly, according to an embodiment of the present invention described above, a height direction interference generation unit is included to interfere laser beams respectively having a different plane direction width, and height direction line width can be improved by irradiating an interference laser beam having an interference fringe direction of height direction on a photosensitive film.

BRIEF DESCRIPTION OF DRAWINGS

FIG. 6 is a cross-sectional view showing a height direction interference generation unit having a mirror, a polarization beam splitter, a quarter wave plate, a plane mirror, a spherical mirror, and an analyzer.

FIG. 7 is a plan view showing an interference fringe having an interference fringe direction of height direction by a height direction line width improvement unit according to an embodiment of the present invention.

FIG. 8 is a graph showing a relation between height direction (Z-axis direction) and intensity of a laser beam, with which exposure depth formed by a fine pattern manufacturing apparatus according to an embodiment of the present invention can be figured out.

FIG. 11 is a flowchart illustrating a fine pattern manufacturing method using interference according to an embodiment of the invention, which can improve height direction resolution in a laser irradiation method.

MODE FOR THE INVENTION

Hereinafter, the configuration and operation of a fine pattern manufacturing apparatus 100 using interference according to an embodiment of the invention will be described, in which height direction resolution can be improved in a laser irradiation method. First, FIG. 5 is a view showing the configuration of a fine pattern manufacturing apparatus 100 using interference according to an embodiment of the invention, which can improve height direction resolution in a laser irradiation method.

Figure 5:
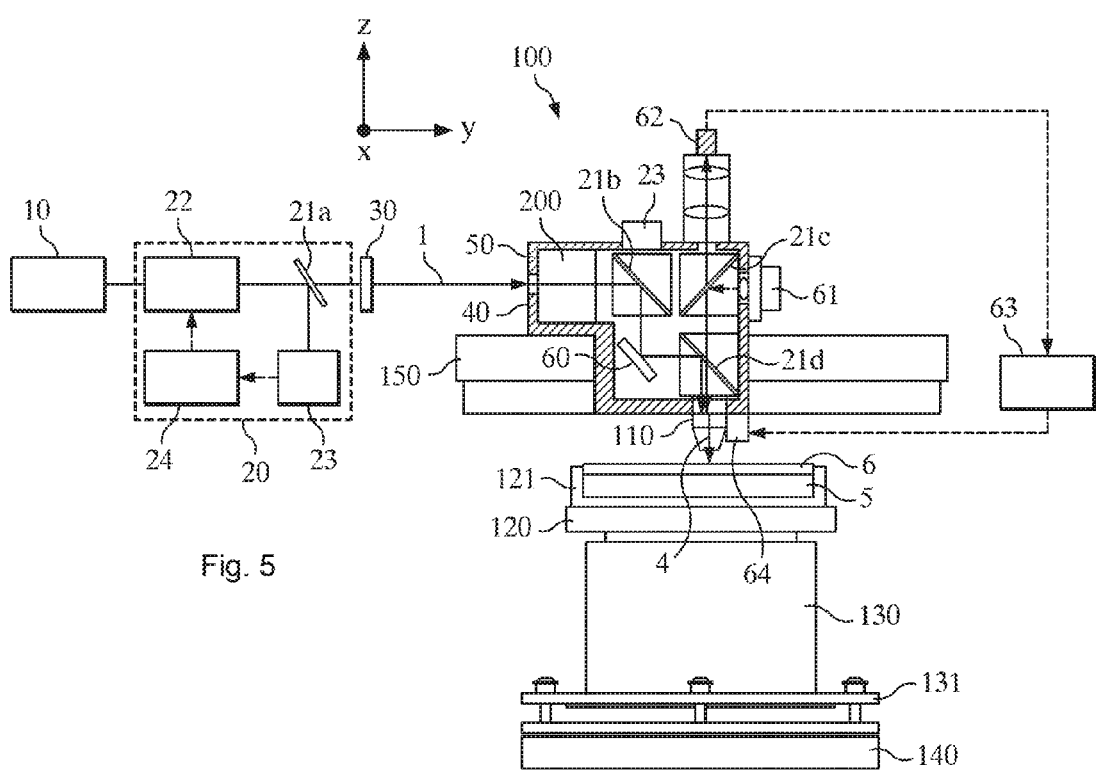
FIG. 5 is a view showing the configuration of a fine pattern manufacturing apparatus using interference according to an embodiment of the invention, which can improve height direction resolution in a laser irradiation method.

As shown in FIG. 5, the fine pattern manufacturing apparatus 100 according to an embodiment of the invention includes a laser generation unit 10, an optical stabilizer 20, a shutter 30, an exposure head 40, a height direction interference generation unit 200, a focus adjustment unit, an exposure lens 110, an X stage 150, a substrate installation unit 120 on which a substrate coated with a photosensitive film is installed, a substrate jig 121, a Y stage 140 and a rotation stage 130.

The amount of light of a laser beam 1 generated by the laser generation unit 10 (an argon Ar laser generation unit is used in the specific embodiment) is adjusted while the light beam passes through the optical stabilizer 20, and the light beam penetrates the shutter 30 which regulates the laser beam 1 and enters the exposure head 40. In the specific embodiment of the present invention, the optical stabilizer 20 may include an acousto-optic modulator 22, a beam splitter 21 and a controller 24 as shown in FIG. 5.

When the laser beam 1 entering the exposure head 40 passes through the height direction interference generation unit 200, a first laser beam 2 having a first specific width 7 and a second laser beam 3 having a second specific width 8 smaller than the first specific width 7 are emitted and overlapped with each other. FIG. 6 is a cross-sectional view showing a height direction interference generation unit having a mirror 210, a polarization beam splitter 220, quarter wave plates 231 and 232, a plane mirror 250, a spherical mirror 240, and an analyzer 50.

First, the laser beam 1 entering the exposure head 40 has the first specific width 7, and such a laser beam 1 is transmitted to a polarizing plate (not shown) and polarized into a P wave and an S wave having polarizing directions perpendicular to each other. Then, the direction of the laser beam 1 having the P and S waves is changed to the Z-axis direction by the mirror 210, and the laser beam 1 enters the polarization beam splitter 220. The polarization beam splitter 220 has a property of reflecting the S wave to the vertical direction and penetrating the P wave. Accordingly, the incident S wave is reflected to the −Y direction by the polarization beam splitter 220 and emitted as the second laser beam 2. As shown in FIG. 6, the emitted first laser beam 2 (shown as a solid line in FIG. 6) is polarized by 45 degrees when it penetrates a first quarter wave plate 231, reflected by the plane mirror 250 and polarized again by 45 degrees by the first quarter wave plate 231, enters and penetrates the polarization beam splitter 220 as a P wave, and is emitted to the analyzer 50. Such a laser beam 2 maintains the first specific width 7 from the entering point to the emitted point.

On the other hand, the P wave penetrating the polarizing plate enters and penetrates the polarization beam splitter 220, penetrates a second quarter wave plate 232 and is reflected by the spherical mirror 240. The second laser beam 3 reflected by the spherical mirror 240 (shown as a dotted line in FIG. 6) has the second specific width 8 which is gradually reduced in the proceeding direction. The second laser beam 3 having such a second specific width 8 is transformed into an S wave again through the second quarter wave plate 232, enters and is reflected by the polarization beam splitter 220, and is emitted to the analyzer 50. Then, polarization directions of the first laser beam 2 and the second laser beam 3 coincide with each other when the first laser beam 2 and the second laser beam 3 penetrate the analyzer 50.

Accordingly, the first laser beam 2 having the first specific width 7 and the second laser beam 3 having the second specific width 8 smaller than the first specific width 7 are overlapped and emitted by the height direction interference generation unit 200. FIG. 7 is a plan view showing an interference fringe having an interference fringe direction of height direction by a height direction line width improvement unit according to an embodiment of the present invention.

The first laser beam 2 and the second laser beam 3 overlapped with each other and respectively having a different width in the plane direction are emitted from the height direction interference generation unit 200, and paths of the first laser beam 2 and the second laser beam 3 are changed by a tilt mirror 60 and the beam splitter 21. Then, the first laser beam 2 and the second laser beam 3 are transmitted to the exposure lens 110. As shown in FIG. 5, the paths that are changed when the first laser beam 2 and the second laser beam 3 are respectively reflected by the tilt mirror 60 are not limited to a specific embodiment, but they can be changed depending on the structure of the exposure head 40 and the position of the exposure lens 110. Such a specific structure apparently does not affect the scope of right of the present invention. As shown in FIG. 5, the tilt mirror 60 can be included in mirrors for changing the paths, or a tilt mirror angle adjustment unit can be included in order to adjust the angle of the tilt mirror 60.

As shown in FIG. 5, the tilt mirror angle adjustment unit may be configured with a photo diode 23 and a beam splitter 21. The beam splitter 21 reflects the first laser beam 2 and the second laser beam 3 and inputs them into the tilt mirror 60, and penetrates light irradiated from the photo diode 23. The light emitted from the photo diode 23 passes through the beam splitter 21, is reflected by the tilt mirror 60 and enters the photo diode 23 again, and thus the angle of the tilt mirror 60 is adjusted.

In addition, the fine pattern manufacturing apparatus 100 according to an embodiment of the present invention may further include a focus adjustment unit. The focus can be adjusted by changing the distance between the exposure lens 10 and the substrate by the focus adjustment unit. It is understood that the focus adjustment unit according to the specific embodiment includes a laser diode 61, a beam splitter 21, an optical detector 62, a focus control unit 63, and a PZT driver 64 as shown in FIG. 5. The light generated by the laser diode 61 is reflected by the beam splitter 21, passes through the beam splitter 21 at a lower position as shown in FIG. 5, and enters the exposure lens 110, and the light reflected by the exposure lens 110 passes through two beam splitters 21 and enters the optical detector 62. The control unit 6 transmits a control signal to PZT driver 64 based on information on the reflected light, and the PZT driver 64 moves the exposure lens 110, and thus the distance spaced between the exposure lens 110 and the substrate is changed.

Then, the first laser beam 2 and the second laser beam 3 passing through the exposure lens 110 interfere with each other around the focus, and thus an interference laser beam 4 having an interference fringe direction of height direction is formed and irradiated on a photosensitive film 6 coated on the top surface of the substrate 5. In addition, FIG. 8 is a graph showing a relation between height direction (Z-axis direction) and intensity of a laser beam, with which exposure depth formed by a fine pattern manufacturing apparatus 100 according to an embodiment of the present invention can be figured out.

Figure 1:
FIG. 1 is a side view mimetically showing a laser beam passing through an exposure lens and irradiated on a photosensitive film having triple layers in a conventional technique.
Figure 2:
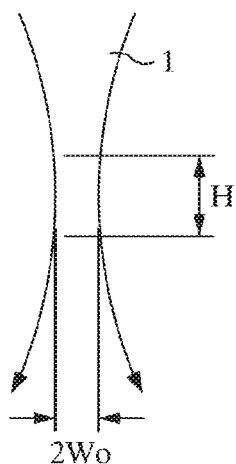
FIG. 2 is an enlarged view showing the laser beam around the focus, passing through the exposure lens of FIG. 1 in a conventional technique.
Figure 3:
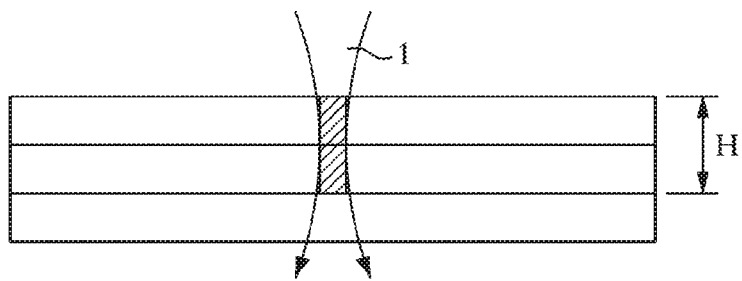
FIG. 3 is an enlarged view showing the laser beam around the photosensitive film, passing through the exposure lens of FIG. 1 in a conventional technique.
Figure 4:
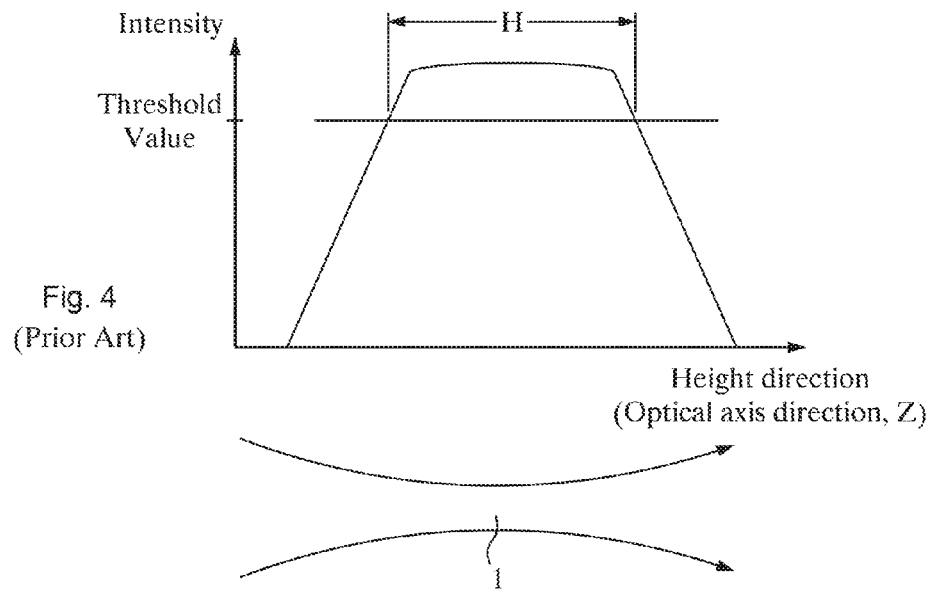
FIG. 4 is a graph showing a relation between height direction (Z-axis direction) and intensity of laser beam, from which exposure depth formed by a conventional fine pattern manufacturing apparatus can be figured out.

As shown in FIG. 8, since the portion exceeding the threshold intensity value is a portion where the photosensitive film 6 is exposed, it is understood that the height direction line width H formed by the fine pattern manufacturing apparatus 100 according to an embodiment of the present invention is reduced compared with the height direction line width (FIG. 4) formed by the conventional fine pattern manufacturing apparatus 100. As shown in FIG. 8, this can be accomplished by forming an interference laser beam 4 having an interference fringe direction of height direction between the first laser beam 2 and the second laser beam 3 by a fine difference between the focal distance of the first laser beam 2 and the focal distance of the second laser beam 3.

Figure 9:
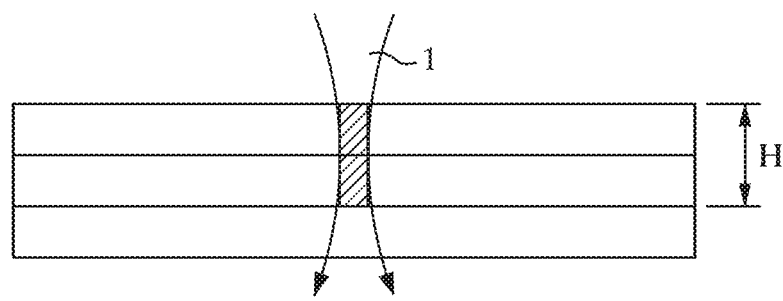
FIG. 9 is an enlarged view showing a laser beam around a photosensitive film, passing through an exposure lens in a conventional technique.
Figure 10:
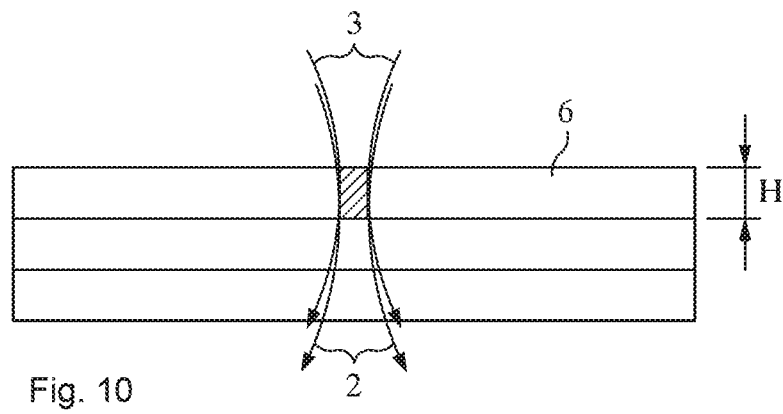
FIG. 10 is an enlarged view showing a laser beam around a photosensitive film, passing through an exposure lens according to an embodiment of the present invention.

FIG. 9 is an enlarged view showing a laser beam 1 around a photosensitive film 6, passing through an exposure lens 110 in a conventional technique, and FIG. 10 is an enlarged view showing a laser beam 4 around a photosensitive film, passing through an exposure lens 110 according to an embodiment of the present invention. As shown in FIGS. 9 and 10, it is understood that the depth H of the photosensitive film 6 exposed by a laser beam of a conventional technique is defective since the uppermost and intermediate layers among the triple layers are exposed to light, whereas the depth of the photosensitive film 6 exposed by the interference laser beam 4 according to an embodiment of the present invention is limited to the uppermost layer.

In addition, the fine pattern manufacturing apparatus 100 according to an embodiment of the present invention may further include an X stage 150 for moving the exposure head 40 in the X-axis direction. The X stage 150 is combined outside of the exposure head 40 and moves the exposure head 40 in the X-axis direction. In addition, the substrate 5 is installed on the substrate installation unit 120, and the substrate 5 can be fixed to the substrate installation unit 120 by the substrate jig 121. The photosensitive film 6 configured of a material whose properties are changed by the interference laser beam 4 is coated on the substrate 5. Any kind of materials whose properties are changed by a laser beam can be used as a material of the photosensitive film 6 without restriction on the type of material.

In addition, the fine pattern manufacturing apparatus 100 according to an embodiment of the present invention may further include a Z stage (not shown) for moving the substrate installation unit 130 in the Z-axis direction, i.e., the vertical axis direction. Then, the rotation stage 130 and the substrate installation unit 120, including the Y stage 140 combined below the rotation stage 130, can be moved in the Y-axis direction as a whole. In addition, a tilt table 131 is further included between the rotation stage 130 and the Y stage 140, and the angle of the tilt mirror can be changed by tilting the rotation stage 130 and the substrate installation unit 120. In addition, the fine pattern manufacturing apparatus 100 according to an embodiment of the present invention may further include a control unit, and thus moving speed can be regulated, and the X, Y and Z stages and the rotation stage can be controlled.

Hereinafter, a fine pattern manufacturing method using interference according to an embodiment of the present invention will be described below, in which height direction resolution can be improved in a laser irradiation method. First, FIG. 11 is a flowchart illustrating a fine pattern manufacturing method using interference according to an embodiment of the invention, which can improve height direction resolution in a laser irradiation method.

First, the focus adjustment unit adjusts the focus of the exposure lens 110, and the length direction axis of the exposure lens 110 coincides with the Z-axis, i.e., the center axis of the rotation stage 130, by driving the X stage 150 and the Y stage 140. In addition, the tilt mirror angle adjustment unit adjusts the angle of the tilt mirror 60, and a preparation step for irradiating the laser beam 1 is performed by installing the substrate 5 coated with the photosensitive film 6 on the substrate installation unit 120.

Then, the laser generation unit 10 generates the laser beam 1 S10, and the laser beam 1 generated by the laser generation unit 10 is stabilized to have a uniform amount of light by the optical stabilizer 20. Then, the laser beam 1 enters the exposure head 40 by way of the shutter 30 S20. The laser beam 1 entering the exposure head 40 is transmitted to the polarizing plate and polarized into the S wave 3 and the P wave 2 whose polarizing directions are perpendicular to each other S30. The S wave 3 and the P wave 2 emitted from the polarizing plate enter the polarization beam splitter 220 by way of the mirror 210.

Then, as descried above, the S wave is reflected by the polarization beam splitter 220 by 90 degrees and emitted as the first laser beam 2 having the first specific width 7, and passes through the first quarter wave plate 231. Then, the S wave is reflected by the plane mirror 250, transformed into the P wave while passing through the first quarter wave plate 231, and emitted passing through the polarization beam splitter 220. The first laser beam 2 is emitted without changing the first specific width 7.

Then, the P wave passing through the polarizing plate penetrates the polarization beam splitter 220, and the P wave is emitted as the second laser beam 3 and passes through the second quarter wave plate 232. Then, the P wave is reflected by the spherical mirror 240 to have the second specific width 8 that is gradually narrowed. The P wave is transformed into the S wave when it passes through the second quarter wave plate 232, and reflected and emitted by the polarization beam splitter 220. Such a second laser beam 3 has the second specific width 8 smaller than the first specific width 7, and the second laser beam 3 is overlapped with the first laser beam 2 and emitted to the analyzer 50 S40.

Then, the first laser beam 2 and the second laser beam 3 respectively having a different width are overlapped and proceed, and polarization directions of the first laser beam 2 and the second laser beam 3 coincide with each other when they pass through the analyzer 50 S50. Then, the first laser beam 2 and the second laser beam 3 having the same polarization direction and different width and overlapped with each other are reflected by the beam splitter 21, the tilt mirror 60 and another beam splitter 21 and enter the exposure lens 110. Then, the first laser beam 2 and the second laser beam 3 entering the exposure lens 110 are transmitted to the exposure lens 110 S60. The first laser beam 2 interferes with the second laser beam 3 around the focus, and the interference laser beam 4 having an interference fringe direction of height direction is formed.

Then, the interference laser beam 4 is irradiated on the photosensitive film 6 coated on the top surface of the substrate 5 S70. If the interference laser beam 4 is irradiated on the photosensitive film 6, properties of the photosensitive film 6 around the portion where the interference laser beam 4 is irradiated are changed. When the interference laser beam 4 is irradiated on the photosensitive film 6, the interference fringe direction becomes height direction (the optical axis direction or the Z-axis direction). Accordingly, as described above, the height direction line width H is reduced compared with that of the conventional technique, and thus resolution can be improved.

In addition, the control unit drives the rotation stage 130 while controlling rotation speed of the rotation stage 130. Then, the control unit moves the exposure head 40 in the X-axis direction while controlling moving speed by driving the X stage 150. In addition, the control unit 160 controls the Y stage 140 and the Z stage to move the substrate installation unit 120 in the Y-axis or Z-axis direction while controlling the moving speed.

After the interference laser beam 4 is irradiated on the photosensitive film 6, the laser generation unit 10 stops generation of laser, and a fine pattern is formed on the substrate 5 S90 by removing the photosensitive film 6 where the interference laser beam 4 is not irradiated S80.

Although the present invention has been described with reference to several preferred embodiments, the description is illustrative of the invention and is not to be construed as limiting the invention. Various modifications and variations may occur to those skilled in the art, without departing from the scope of the invention as defined by the appended claims.

The invention claimed is:

1. A fine pattern manufacturing apparatus capable of improving height direction resolution using interference in a laser irradiation method, the apparatus comprising:
    a laser generation unit for generating a laser beam having a first specific width;
    a beam splitter for emitting a first laser beam by reflecting a portion of the generated laser beam, and emitting a second laser beam by passing through the beam splitter a remaining portion of generated laser beam;
    a plane mirror for reflecting the first laser beam emitted from the beam splitter and inputting the first laser beam into the beam splitter again, a first quarter wave plate interposed in a path of the first laser beam between the beam splitter and the plane mirror;
    a spherical mirror for reflecting the second laser beam emitted from the beam splitter and inputting a second laser beam having a second specific width smaller than a first specific width into the beam splitter again, a second quarter wave plate interposed in a path of the second laser beam between the beam splitter and the spherical mirror;
    an analyzer into which the first laser beam having the first specific width and the second laser beam having the second specific width are inputted;
    an exposure lens for penetrating the first laser beam and the second laser beam passing through the analyzer, and irradiating an interference laser beam generated by interference between the first laser beam and the second laser beam on a photosensitive film coated on a substrate, the photosensitive film having a plurality of layers; and
    a focus adjustment unit for adjusting a focus of the exposure lens by adjusting a distance between the exposure lens and the photosensitive film, wherein the first laser beam and the second laser beam interfere with each other to have an interference fringe direction of height direction around a focus of the exposure lens.

2. The apparatus according to claim 1, further comprising: an exposure head in which the beam splitter, the plane mirror, the spherical mirror, the analyzer and the exposure lens are installed.

3. The apparatus according to claim 1, further comprising:
    an X stage for moving the exposure head in an X-axis direction, i.e., an axis being in a plane direction;
    a substrate installation unit on which the substrate is installed; and a Y stage for moving the substrate installation unit in a Y-axis direction, i.e., a plane direction perpendicular to the X-axis direction.

4. The apparatus according to claim 3, further comprising a rotation stage for rotating the substrate installation unit on a Z-axis, i.e., the direction being on a vertical axis.

5. The apparatus according to claim 4, further comprising a control unit for controlling at least any one of the X stage, the Y stage and the rotation stage.

* * * * *